(12) United States Patent
Lewis et al.

(10) Patent No.: US 6,428,886 B1
(45) Date of Patent: Aug. 6, 2002

(54) METHOD FOR ATTENUATING THERMAL SENSATION WHEN HANDLING OBJECTS AT NON-BODY TEMPERATURE

(75) Inventors: David Andrew Lewis, Carmel; Lawrence Shungwei Mok, Brewster, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/966,168

(22) Filed: Nov. 7, 1997

Related U.S. Application Data (60) Provisional application No. 60/048,279, filed on Jun. 2, 1997, and provisional application No. 60/006,758, filed on Jun. 2, 1997.

(51) Int. Cl.⁷ .......................... B32B 15/00; B32B 18/00; B32B 25/00; B32B 31/00
(52) U.S. Cl. .................... 428/332; 428/411.1; 428/457; 99/385; 99/372; 181/131; 219/443; 361/705; 361/706; 381/67; 427/307
(58) Field of Search ................................ 428/451, 331, 428/209, 332, 458, 457, 461, 411.1, 312.2; 523/444; 524/494; 361/705, 706; 606/1; 427/307; 181/131; 381/67; 99/385, 372; 219/443

(56) References Cited

U.S. PATENT DOCUMENTS

| | | | |
|---|---|---|---|
| 2,029,679 A | 2/1936 | Seving et al. ................. 154/45 |
| 3,055,831 A | 9/1962 | Barnett et al. ................. 252/62 |
| 3,328,642 A | 6/1967 | Haumesser et al. ......... 317/100 |
| 3,647,695 A | 3/1972 | Hasegawa et al. ............. 252/62 |
| 3,705,909 A | 12/1972 | Scott et al. .............. 260/329.3 |
| 3,831,184 A | * 8/1974 | Morse ........................ 354/237 |
| 3,933,666 A | 1/1976 | Yoneo et al. .................. 252/62 |
| 4,105,820 A | * 8/1978 | Antoni ........................ 428/213 |
| 4,154,887 A | * 5/1979 | Morshauser et al. ........ 428/201 |
| 4,623,390 A | 11/1986 | Delmonico .............. 106/15.05 |
| 4,926,197 A | 5/1990 | Childers et al. ........ 346/140 R |
| 5,008,689 A | 4/1991 | Pan et al. ............... 346/140 R |
| 5,045,971 A | 9/1991 | Ono et al. ................... 361/386 |
| 5,138,938 A | * 8/1992 | McClean ...................... 99/331 |
| 5,308,387 A | * 5/1994 | James ........................ 427/307 |
| 5,472,920 A | 12/1995 | Dubois et al. .............. 501/103 |
| 5,641,584 A | * 6/1997 | Anderson et al. ........... 428/703 |
| 5,725,944 A | * 3/1998 | Jones et al. ................. 428/336 |
| 5,829,515 A | * 11/1998 | Jeffries et al. ............. 165/80.3 |
| 5,848,904 A | * 12/1998 | Kikuchi ...................... 439/136 |
| 5,914,508 A | * 6/1999 | Varmazis et al. ........... 257/275 |

OTHER PUBLICATIONS

Encyclopedia of Polymer Science and Engineering, vol. 1: Adhesion and Bonding, pp. 494–497, Aug. 1985.*
Medical Device Register, vol. 1, pp. III–619 to III–620, Sep. 1988.*
J.P. Holman, Heat Transfer, McGraw–Hill (New York:1976), pp. 95–101, Jan. 1976.

* cited by examiner

Primary Examiner—Paul Thibodeau
Assistant Examiner—Ramsey Zacharia
(74) Attorney, Agent, or Firm—Daniel P. Morris; Alek P. Szecsy (57) ABSTRACT

A method for fabricating an object to attenuate thermal sensation when handling the object at non-body temperature, and an object fabricated in accord with the method. There is first provided a substrate which has a first surface subject to handling. There is then formed upon the first surface of the substrate a coating. The coating has an optimal density, an optimal thermal conductivity and an optimal thickness such that when the substrate having the coating formed thereupon is equilibrated at a non-body temperature differing from a body temperature and the coating is subsequently contacted with a body at the body temperature during handling, the temperature of the surface of the coating at a contact point of the body with the coating changes precipitously to a temperature near the body temperature and subsequently returns towards the non-body temperature at a rate which permits handling of the coating at the location of the first surface of the substrate by the body with attenuated thermal sensation. The coating simultaneously also minimally attenuates a steady state thermal transfer with respect to the substrate in comparison with an otherwise equivalent substrate absent the coating.

8 Claims, 7 Drawing Sheets

METHOD FOR ATTENUATING THERMAL SENSATION WHEN HANDLING OBJECTS AT NON-BODY TEMPERATURE

CROSS-REFERENCE TO RELATED APPLICATION

This application claims the benefit of U.S. Provisional Application Ser. No. 60/048,279, filed Jun. 2, 1997.

This application claims priority from Provisional Application Ser. No. 60/006,758 which was filed on Jun. 2, 1997.

BACKGROUND OF THE INVENTION

1. Field of the Invention

The present invention relates generally to methods for preventing thermal sensations when handling objects at non-body temperatures. More particularly, the present invention relates to methods for attenuating hot and cold thermal sensations when handling objects at non-body temperatures, while maintaining proper heat transfer into or from those objects.

2. Description of the Related Art

As the electrical power operating requirements within handheld and mobile electronics products continues to increase and the electronics enclosure volumes of handheld and mobile electronics products continues to decrease, it has become increasingly important within advanced handheld and mobile electronics products to provide adequate means for efficiently dissipating thermal loads which are generated in normal operation of those advanced handheld and mobile electronics products.

Handheld and mobile electronics products which are particularly susceptible to generating significant thermal loads whose dissipation is required for proper operation of those handheld and mobile electronics products typically include handheld and mobile electronics products whose operation employs high power microprocessor circuitry and/or high speed rigid disk drive operation. Such handheld and mobile electronics products typically include, but are not limited to, mobile computers and mobile data communications systems. Efficient dissipation of thermal loads from within electronics enclosure volumes of such electronics products is particularly desirable since elevated temperatures within such electronics enclosure volumes often facilitate premature microprocessing electrical circuitry failure and/or rigid disk drive electrical or mechanical failure.

In light of the continuing trend towards decreasing handheld and mobile electronics products weights and decreasing handheld and mobile electronics products electronics enclosure volumes, it is atypical within advanced handheld and mobile electronics products fabrication that active cooling means, such as fans, are employed to fully dissipate thermal loads from within electronics enclosure volumes within those advanced handheld and mobile electronics products. Rather, thermal load dissipation from within electronics enclosure volumes within handheld and mobile electronics products is typically largely undertaken through passive means, such as conduction, convection and radiation, while employing various electronics enclosure volume surfaces of the electronics products as surfaces through which thermal loads from within those electronics enclosure volumes may be dissipated.

Typical electronics enclosure volume surfaces through which thermal loads are dissipated within advanced handheld and mobile electronics products include but are not limited to electronics enclosure volume case surfaces, electronics enclosure volume keyboard surfaces and electronics enclosure volume keypad surfaces. The dissipation of thermal loads through such electronics enclosure volume surfaces is often largely governed by the thermal conductivity characteristics of a bulk material from which is formed the electronics enclosure volume surface. Common bulk materials which may be employed in forming electronics enclosure volume surfaces which assure efficient dissipation of thermal loads from within electronics enclosure volumes within handheld and mobile electronics products include metals, such as but not limited to aluminum, magnesium and alloys thereof, as well as several polymer materials, such as but not limited to carbon fiber filled polycarbonate polymer materials, acrylonitrile butadiene styrene (ABS) polymer materials and blends thereof.

Although it is thus common in the art of handheld and mobile electronics products fabrication to employ electronics enclosure volume surfaces as a means to dissipate thermal loads from within electronics enclosure volumes incident to normal operation of those electronics products, dissipation of thermal loads through electronics enclosure volume surfaces within advanced handheld and mobile electronics products is not entirely without problems within advanced handheld and mobile electronics products fabrication.

With regard to handheld and mobile electronics products which require dissipation of particularly high levels of thermal power within exceedingly limited electronics enclosure volume surface areas (ie: a thermal power dissipation of greater than about 0.03 watts per square centimeter of electronics enclosure surface area), electronics enclosure volume surfaces within those advanced handheld and mobile electronics products may readily reach temperatures of greater than about 60 degrees centigrade. Such elevated temperatures detract from a normally desirable, comfortable and safe operation of those handheld and mobile electronics products.

It is thus desirable in the art of handheld and mobile electronics products fabrication to provide methods and materials through which may be fabricated handheld and mobile electronics products which simultaneously exhibit: (1) efficient dissipation of thermal loads through electronics enclosure volume surfaces of those handheld and mobile electronics products when operating those handheld and mobile electronics products, and (2) substantial attenuation of heat sensation upon human contact of those electronics enclosure volume surfaces when handling and operating those handheld and mobile electronics products. It is towards these seemingly contradictory goals that the present invention is most specifically directed.

In a more general sense, the present invention is also directed towards providing methods and materials through which may be fabricated thermally conductive objects, such as but not limited to handheld and mobile electronics products, as well as other electronics products and non-electronics products, which simultaneously exhibit: (1) efficient dissipation of thermal loads into or from those thermally conductive objects through surfaces of those thermally conductive objects; and (2) substantial attenuation of thermal sensation upon contact of the surfaces of those thermally conductive objects when handling and operating those thermally conductive objects. It is towards these analogously contradictory goals that the present invention is more generally directed.

SUMMARY OF THE INVENTION

A first object of the present invention is to provide a method for fabricating an object, and an object fabricated in accord with the method, where the method provides for efficient dissipation of a thermal load into or from the object through a surface of the object.

A second object of the present invention is to provide a method in accord with the first object of the present invention, where there is simultaneously attenuated a thermal sensation when contacting the surface of the object with a body when handling or operating the object.

A third object of the present invention is to provide a method in accord with the first object of the present invention or the second object of the present invention, where the object is a handheld or mobile electronics product.

A fourth object of the present invention is to provide a method in accord with the first object of the present invention, the second object of the present invention or the third object of the present invention, which method is readily manufacturable.

In accord with the objects of the present invention, there is provided by the present invention a method for fabricating an object, and an object fabricated in accord with the method. To practice the method of the present invention, there is first provided a substrate having a first surface subject to handling. There is then formed upon the first surface of the substrate a coating. The coating has an optimally low density, an optimally low thermal conductivity, an optimally low heat capacity and an optimally minimal thickness such that when the substrate having the coating formed thereupon is equilibrated at a non-body temperature differing from a body temperature and the coating is subsequently contacted with a body at the body temperature during handling, the temperature of the surface of the coating at a contact point of the body with the coating changes precipitously to a temperature near the body temperature and subsequently partially returns towards the non-body temperature at a rate which permits handling of the substrate at the location of the coating by the body with attenuated thermal sensation. In addition, the coating simultaneously also minimally attenuates a steady state heat transfer with respect to the substrate in comparison with an otherwise equivalent substrate absent the coating.

The method of the present invention contemplates an object fabricated in accord with the method of the present invention.

The present invention provides a method for fabricating an object while: (1) providing an efficient thermal dissipation of a thermal load into or from the object through a surface of the object, while simultaneously; (2) attenuating a thermal sensation when contacting the object in normal handling or operation of the object through the surface of the object. The method of the present invention realizes the foregoing objects by forming upon a first surface of a substrate from which is formed an object a coating. The first surface of the substrate is subject to handling. The coating has an optimally low density, an optimally low thermal conductivity, an optimally low heat capacity and an optimally minimal thickness such that there is provided: (1) an efficient thermal dissipation of a thermal load into or from the substrate at the location of the coating, while simultaneously; (2) attenuating a thermal sensation when contacting the coating by a body in normal handling or operation of the substrate at the location of the coating.

The method of the present invention may be employed where the object is a handheld or mobile electronics product. The method of the present invention does not discriminate with respect to the nature of the object for which there may be simultaneously: (1) provided an efficient thermal dissipation of a thermal load into or from the object through a surface of the object, and; (2) attenuated a thermal sensation when contacting the object with a body in normal handling or operation of the object through the surface of the object. Thus, although the method of the present invention is most likely to provide value when simultaneously: (1) providing an efficient thermal dissipation of a thermal load from within a handheld or mobile electronics product electronics enclosure volume through an electronics enclosure volume surface of the handheld or mobile electronics product, and; (2) attenuating a thermal sensation when contacting the handheld or mobile electronics product electronics enclosure volume surface with a body in normal handling or operation of the handheld or mobile electronics product, the method of the present invention may also be employed in fabricating objects other than handheld and mobile electronics products. The method of the present invention may in general be employed in fabricating objects including but not limited to handheld electronics products, mobile electronics products, other electronics products, consumer products, industrial products and medical instruments.

The method of the present invention is readily manufacturable. As is disclosed within the Description of the Preferred Embodiment, methods and materials through which coatings may be formed upon substrates with optimally low densities, optimally low thermal conductivities, optimally low heat capacities and optimally minimal thicknesses to realize the objects of the present invention are accessible through coatings technology which may be employed within at least handheld and mobile electronics products electronics enclosure volume surface fabrication, and presumable also other object fabrication. Thus, the method of the present invention, and an object fabricated in accord with the method of the present invention, is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating an object, such as but not limited to a handheld or mobile electronics product, and an object fabricated in accord with the method, where through the method there is formed the object which simultaneously: (1) provides for efficient dissipation of a thermal load into or from the object through a surface of the object, and; (2) attenuates a thermal sensation when contacting the object in normal handling or operation of the object through the surface of the object. The method of the present invention realizes the foregoing objects by forming upon a first surface of a substrate from which is formed the object a coating. The first surface of the substrate is subject to handling. The coating has an optimally low density, an optimally low thermal conductivity, an optimally low heat capacity and an optimally minimal thickness such that there is simultaneously provided: (1) an efficient dissipation of a thermal load into or from the substrate at the location of the coating; and (2) an attenuated thermal sensation when handling the substrate at the location of the coating in normal handling or operation of an object fabricated from the substrate.

Although the preferred embodiment of the present invention discloses the invention within the context of simultaneously providing: (1) efficient thermal dissipation of a thermal load from within an electronics enclosure volume of a handheld or mobile electronics product through an electronics enclosure volume surface of the handheld or mobile electronics product; and (2) an attenuated heat sensation when contacting the handheld or mobile electronics product in normal handling or operation of the handheld or mobile electronics product through the electronics enclosure volume surface, the method of the present invention may also be employed when fabricating objects other than handheld and mobile electronics products while simultaneously: (1) optimizing thermal load dissipation into or from those objects; and (2) minimizing thermal sensations when handling those objects.

In that regard, the method of the present invention may in general be employed in fabricating objects including but not limited to handheld electronics products, mobile electronics products, other electronics products, consumer products, industrial products and medical instruments. Consumer products and industrial products may include, but are not limited to, toasters, sandwich makers, hotplates and refrigerated products. Medical instruments may include, but are not limited to, stethoscopes. Within the general method of the present invention, there may be attenuated either a hot thermal sensation or a cold thermal sensation when contacting an object with a human body or other warm blooded body when handling or operating the object, while simultaneously minimally attenuating a steady state heat transfer with respect to the object.

Figure 1:
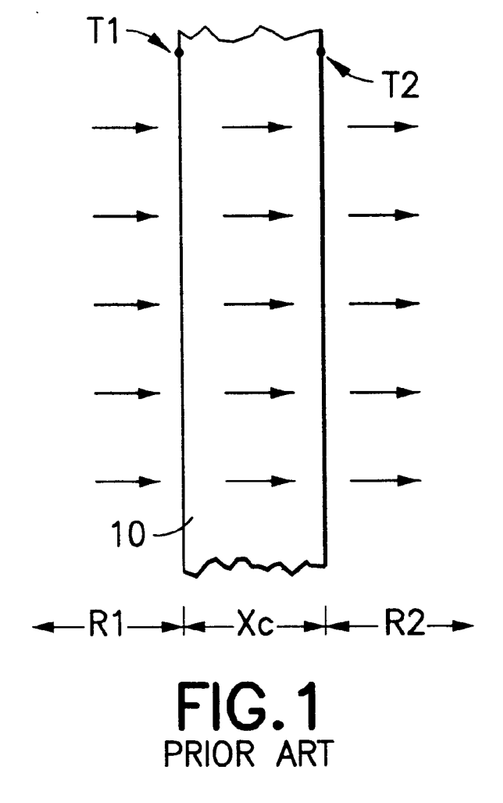
FIG. 1 shows a schematic cross-sectional diagram illustrating steady state heat flow through a substrate in absence of the present invention.

Referring now to FIG. 1, there is shown a schematic cross-sectional diagram illustrating steady state heat flow through a substrate from which may be fabricated a heat generating object at non-body temperature, in absence of the present invention. Shown in FIG. 1 is a substrate 10 of thickness Xc. Within FIG. 1, the substrate 10 separates a high temperature region R1 from a low temperature region R2, while the arrows emanating from the left and terminating to the right within in FIG. 1 represent thermal heat flow. There is also shown in FIG. 1: (1) a first temperature T1 at a first temperature measurement location at the surface of the substrate 10 adjacent the high temperature region R1; and (2) a second temperature T2 at a second temperature measurement location at the surface of the substrate 10 adjacent the low temperature region R2.

Within the preferred embodiment of the present invention, the substrate 10 is preferably an electronics products substrate chosen from the group of electronics products substrates consisting of electronics enclosure volume case substrates, electronics enclosure volume keyboard substrates and electronics enclosure volume keypad substrates. More preferably, the substrate 10 is an electronics enclosure volume case substrate employed in fabricating an electronics enclosure within a handheld or mobile electronics product. Preferably, the electronics enclosure volume case substrate has a thickness of from about 0.1 to about 3.0 millimeters. Within a general embodiment of the present invention, the substrate 10 may be a substrate employed in fabricating any of the other objects disclosed above, with an appropriate thickness.

Within both the preferred embodiment of the present invention and a general embodiment of the present invention, the substrate 10 may be formed from a material chosen from the group of materials including but not limited to metals, metal alloys, metal oxides, unfilled plastics, filled plastics, reinforced plastics and composites thereof. Within both the preferred embodiment of the present invention and a general embodiment of the present invention, the substrate 10 is preferably formed of a material which has a thermal conductivity of greater than about 0.3 watts per meter-degree centigrade.

Within FIG. 1, the first temperature T1 at the first temperature measurement location and the second temperature T2 at the second temperature measurement location are related, under steady state conditions, by equation 1, as follows.

$$T1 = q(Xc/kc) + T2 \quad (1)$$

Within equation 1, q equals the thermal flux incident upon the first surface of the substrate 10 adjacent to the high temperature region R1 and kc equals the thermal conductivity of the material from which is formed the substrate 10. For a typical thermal flux q incident upon the first surface of a substrate 10 of thickness about 1.2 millimeters at about 250 watts per square meter, there is typically observed: (1) a temperature differential T1–T2 of less than about 0.002 degrees centigrade for a substrate 10 formed of an aluminum material having a thermal conductivity of about 204 watts per meter-degree centigrade; and (2) a temperature differential T1–T2 of about 2 degrees centigrade for a substrate 10 formed of a polymer material having a thermal conductivity of about 0.15 watts per meter-degree centigrade.

Figure 2:
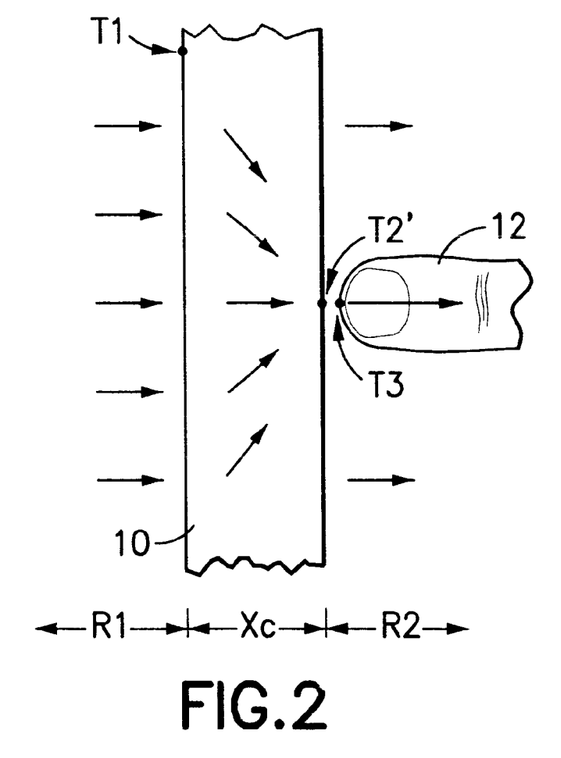
FIG. 2 shows a schematic cross-sectional diagram illustrating transient heat flow through a substrate at non-body temperature contacted with a body at body temperature in absence of the present invention.

Referring now to FIG. 2, there is shown a schematic cross-sectional diagram illustrating transient heat flow through the substrate 10 initially at steady state heat flow in accord with the schematic cross-sectional diagram of FIG. 1, but wherein the second surface of the substrate 10 is contacted with a body 12 (ie: a finger of a human body which is otherwise not shown).

Within FIG. 2, the contact point of the body 12 with second surface of the substrate 10 represents a third temperature measurement location at which there is measured a third temperature T3, while the corresponding contact point of the second surface of the substrate 10 with the body represents a specific second temperature measurement location at which there is measured a second temperature T2'. Within the preferred embodiment of the present invention, as well as many general embodiments of the present invention, the body 12 is typically a thermally conductive body, and the body 12 typically provides a relatively large sink for thermal flow through the substrate 10 in comparison with thermal flow dissipation through thermal convection to the ambient within the low temperature region R2 from the second surface of the thermally conductive substrate 10. As is illustrated within the schematic cross-sectional diagram of FIG. 2, lateral thermal flow within the substrate 10 converges at the contact point of the body 12 with the second surface of the substrate 10, thus, a third temperature T3 at the third temperature measurement location typically rapidly approaches a second temperature T2' at the specific second temperature measurement location on the second surface of the substrate 10 when the body 12 contacts the second surface of the substrate 10.

Although not illustrated within the schematic cross-sectional diagram of FIG. 2, within the preferred embodiment of the present invention, although not necessarily within a general embodiment of the present invention, the temperature of the body 12 prior to contact with the second surface of the substrate 10 is typically, although not necessarily always, lower than the temperature within the first region R1 but greater than the temperature within the second region R2.

A first temperature T1 at the first temperature measurement location, a second temperature T2' at the specific second temperature measurement location and a third temperature T3 at the third temperature measurement location within the schematic cross-sectional diagram of FIG. 2 may be determined as a function of contact time of the body 12 with the second surface of the substrate 10 through simultaneous solution of an appropriate series of transient heat transfer equations through methods as are known in the art of heat transfer. For an example of an appropriate series of heat transfer equations, see J. P. Holman, Heat Transfer, McGraw-Hill (New York: 1976), pp. 95–101, the teachings of which are incorporated herein fully by reference. Within the preferred embodiment of the present invention, and most general embodiments of the present invention, simultaneous solution of the appropriate series of heat transfer equations as a function of contact time of the body 12 with the substrate 10 is typically not readily analytically achievable. Rather, simultaneous solution of the appropriate series of heat transfer equations is typically undertaken through a finite element approximation, as is conventional in the art of thermal transfer calculations, to provide a first temperature profile of the first temperature T1 at the first temperature measurement location, a second temperature profile of the second temperature T2' at the specific second temperature measurement location and a third temperature profile of the third temperature T3 at the third temperature measurement location as a function of a series of contact times of the body 12 with the second surface of the substrate 10.

A typical, but by no means exclusive, finite element approximation method may also be found within J. P. Holman, Heat Transfer, McGraw-Hill (New York: 1976), pp. 57–145.

Figure 3:
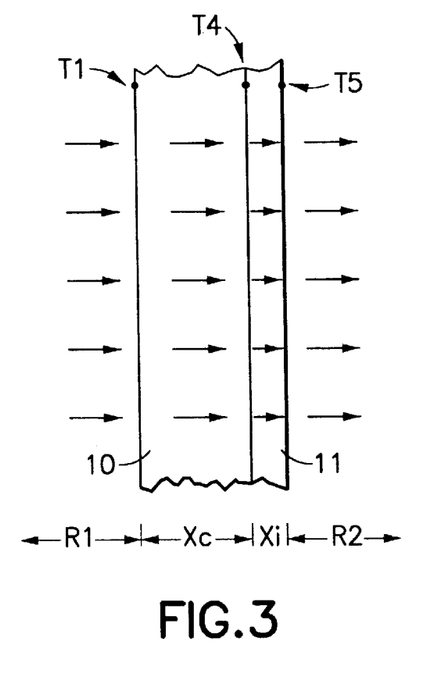
FIG. 3 shows a schematic cross-sectional diagram illustrating steady state heat flow through a substrate having formed thereupon a coating in accord with the present invention.

Referring now to FIG. 3, there is shown a schematic cross-sectional diagram illustrating steady state heat flow through a substrate in accord with the preferred embodiment of the present invention. Shown in FIG. 3 is a schematic cross-sectional diagram of a substrate 10 otherwise equivalent to the substrate 10 whose schematic cross-sectional diagram is illustrated in FIG. 1, but wherein there is formed upon the second surface of the substrate 10 a coating 11 of thickness Xi.

Within the preferred embodiment of the present invention, and a general embodiment of the present invention, the coating 11 has an optimally low density, an optimally low thermal conductivity, an optimally low heat capacity and an optimally minimal thickness Xi such that when the substrate 10 having the coating 11 formed thereupon is equilibrated at a non-body temperature with respect to the high temperature region R1, differing from a body temperature of the body 12, and the coating 11 is subsequently contacted with the body 12 at the body temperature during handling, the temperature of the surface of the coating 11 at a contact point of the body 12 with the coating 11 changes precipitously to a temperature near the body temperature and subsequently returns towards the non-body temperature at a rate which permits handling of the substrate 10 at the location of the coating 11 by the body 12 with minimal thermal sensation. In addition, the coating 11 simultaneously also minimally attenuates a steady state heat transfer with respect to the substrate 10 as illustrated in FIG. 3 in comparison with the otherwise equivalent substrate 10 absent the coating 11, as illustrated in FIG. 1.

Also shown within FIG. 3 is: (1) a fourth temperature T4 at a fourth temperature measurement location at a newly formed interface derived from the second surface of the substrate 10 with the coating 11; and (2) a fifth temperature T5 at a fifth temperature measurement location at the surface of the coating 11 adjacent the low temperature region R2.

The interrelationship between a first temperature T1 at the surface of the substrate 10 adjacent the high temperature region R1 and a fifth temperature T5 at the surface of the coating 11 adjacent the low temperature region R2 is defined under steady state conditions by equation 2, as follows.

$$T1 = q(Xc/kc + Xi/ki) + T5 \qquad (2)$$

Within equation 2, ki equals the thermal conductivity of a material from which is formed the coating 11. Equation 2 follows analogously from equation 1. Similarly with equation 1, equation 2 may readily be solved analytically.

Figure 4:
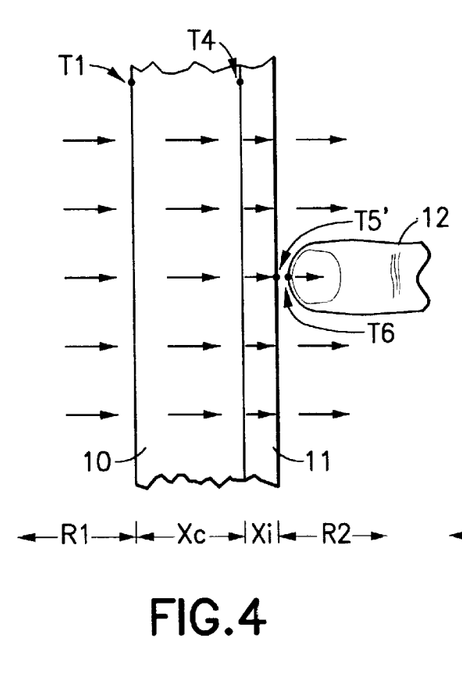
FIG. 4 shows a schematic cross-sectional diagram illustrating transient heat flow through a substrate at non-body temperature, the substrate having formed thereupon a coating contacted with a body at body temperature, at the time of contact of the coating with the body, in accord with the present invention.
Figure 5:
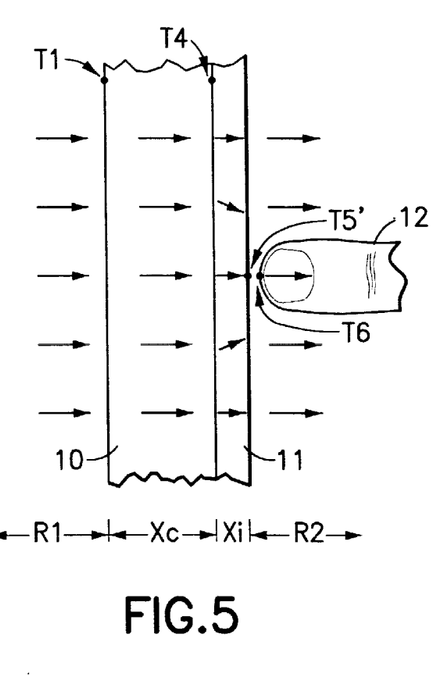
FIG. 5 shows a schematic cross-sectional diagram illustrating transient heat flow through a substrate at non-body temperature, the substrate having formed thereupon a coating contacted with a body at body temperature, at a time past the time of contact of the coating with the body, in accord with the present invention.

Referring now to FIG. 4 and FIG. 5, there is shown a pair of schematic cross-sectional diagrams illustrating transient heat flow through the substrate 10 having the coating 11 formed upon its second surface when the coating 11 is contacted with the body 12 under conditions otherwise equivalent to those employed within the schematic cross-sectional diagram of FIG. 2, but wherein the body 12 contacts the coating 11 rather than the substrate 10. Shown in FIG. 4 is a schematic cross-sectional diagram illustrating thermal flow through the substrate 10 and the coating 11 immediately upon contact of the coating 11 with the body 12, while within FIG. 5 there is shown a schematic cross-sectional diagram illustrating thermal flow through the substrate 10 and the coating 11 at a later time after contact of the coating 11 with the body 12. Within both FIG. 4 and FIG. 5, there is also defined: (1) a sixth temperature T6 at a sixth temperature measurement location at the point of contact of the body 12 with the coating 11; and (2) a fifth temperature T5' at a specific fifth temperature measurement location at a point of contact of the coating 11 with the body 12.

As is shown in FIG. 4, immediately upon contact of the body 12 with the coating 11, only a small amount of thermal flux flows into the body 12 when the surface of the coating 11 is contacted with the body 12. As is also shown in FIG. 4, the steady state thermal flow through the substrate 10 and the coating 11 remains otherwise largely unchanged.

As is shown in FIG. 5, at a somewhat later time after contact of the body 12 with the coating 11, a somewhat larger, but still substantially attenuated, thermal flux flows into the body 12. The substantially attenuated thermal flow as illustrated in FIG. 5 typically provides a slight rise in the sixth temperature T6 at the sixth temperature measurement location, with an attenuated if not minimal thermal heat sensation within the body 12. The somewhat larger thermal flux flowing into the body 12 as illustrated in FIG. 5 in comparison with FIG. 4 derives from a slightly redirected thermal flow through the coating 11 concentrated and focused towards the contact point of the body 12 with the coating 11, as illustrated in FIG. 5.

Within the schematic cross-sectional diagrams of FIG. 4 and FIG. 5, the first temperature T1 at the first temperature measurement location, the fourth temperature T4 at the fourth temperature measurement location, the fifth temperature T5' at the specific fifth temperature measurement location and the sixth temperature T6 at the sixth temperature measurement location may be determined as a function of contact time of the body 12 with the coating 11 by simultaneous solution of an appropriate second series of heat transfer equations analogous to the series of heat transfer equations whose simultaneous solution is employed in determining the first temperature T1 at the first temperature measurement location, the second temperature T2' at the specific second temperature measurement location and the third temperature T3 at the third temperature measurement location within the schematic cross-sectional diagram of FIG. 2, as discussed above. Similarly, the appropriate second series of heat transfer equations is also not readily analytically simultaneously solved, and is typically solved simultaneously through a finite element approximation analogous or equivalent to the finite element approximation employed in solving for the first temperature T1 at the first temperature measurement location, the second temperature T2' at the specific second temperature measurement location and the third temperature T3 at the third temperature measurement location as a function of body 12 contact time with the thermally conductive substrate 10 as illustrated in FIG. 2.

As noted above, the coating 11 provides the desirable attenuated thermal sensation to the substrate 10 and simultaneously minimally attenuates steady state thermal transfer with respect to the substrate 10 through choice of an optimally low density, an optimally low thermal conductivity, an optimally low heat capacity and an optimally minimal thickness when forming the coating 11.

With respect to the optimally low density of the coating 11, for both the present invention and the preferred embodiment of the present invention the optimally low density of the coating 11 provides minimal thermal flow into the body 12 when the body 12 contacts the surface of the coating 11. Within the present invention and the preferred embodiment of the present invention, the coating 11 preferably has a low density of from about 0.05 to about 1.2 grams per cubic centimeter. More preferably, the coating 11 has a density of from about 0.05 to about 0.2 grams per cubic centimeter. Most preferably, the coating 11 has a density of from about 0.075 to about 0.1 grams per cubic centimeter.

Similarly, within the present invention and the preferred embodiment of the present invention, the optimally low thermal conductivity of the coating 11 provides a barrier to substantial lateral thermal flow through either the substrate 10 or the coating 11 to the contact point of the surface of the coating 11 with the body 12. Preferably, the coating 11 is formed of a material having a low thermal conductivity of from about 0.02 to about 0.15 watts per meter-degree centigrade. More preferably, the coating 11 is formed from a material having a thermal conductivity of from about 0.03 to about 0.08 watts per meter-degree centigrade. Most preferably, the coating 11 is formed from a material having a thermal conductivity of from about 0.03 to about 0.06 watts per meter-degree centigrade.

Finally, within the present invention and the preferred embodiment of the present invention, the coating 11 is formed with an optimally minimal thickness such that there is avoided within the present invention and the preferred embodiment of the present invention a thermal punch-through effect from the substrate 10 through the coating 11 to the contact point of the coating 11 with the body 12. Preferably, the thickness of the coating 11 is from about 0.1 to about 3.0 millimeters. More preferably, the thickness of the coating 11 is from about 0.3 to about 1.0 millimeters. Most preferably, the thickness of the thermally insulating coating 11 is from about 0.4 to about 0.7 millimeters.

The final parameter of the coating 11 which is relevant to the present invention but is not usually controllable within a particularly large range is the heat capacity of the coating. Within the present invention and the preferred embodiment of the present invention, the coating 11 preferably has a heat capacity of from about 0.70 to about 1.15 joules per gram per degree centigrade. More preferably, the coating 11 has a heat capacity of from about 0.85 to about 1.00 joules per gram per degree centigrade. Most preferably, the coating 11 has a heat capacity of from about 0.85 to about 0.95 joules per gram per degree centigrade.

The foregoing preferred, more preferred and most preferred limits for the density, the thermal conductivity, the thickness and the heat capacity of the coating 11 within both the present invention and the preferred embodiment of the present invention are predicated upon a high temperature region R1 temperature of from about 45 to about 120 degrees centigrade, a low temperature region R2 temperature of from about 0 to about 40 degrees centigrade and a body 12 temperature of from about 30 to about 39 degrees centigrade. Significant variations within the above temperatures, particularly with respect to the high temperature region R1 temperature and the low temperature region R2 temperature, may require additional variations within the density, the heat capacity and, particularly, the thickness, of the coating 11.

With respect to the materials from which may be formed the coating 11, the coating 11 may be formed from materials including but not limited to foamed polymer materials, hollow bead filled polymer materials, and low density inorganic materials. The polymer materials from which may be formed the foamed polymer materials and the hollow bead filled polymer materials may be selected from the group of polymer materials including but not limited to polyurethane polymer materials, epoxy polymer materials, phenolic polymer materials, rubber polymer materials, silicone polymer materials and polystyrene polymer materials. The low density inorganic materials may include, but are not limited to highly porous glasses and ceramics, such as may be formed through aero sol-gels, as well as highly porous metals and metal oxides. Within the preferred embodiment of the present invention foamed polyurethane polymer materials are preferred for forming the coating 11.

Similarly, the coating 11 may be formed upon the substrate 10 through any of several coating methods as are generally known in the art. Such coating methods may include, but are not limited to, deposition coating methods, such as but not limited to roll coating methods, spray coating methods, brush coating methods, laminating methods (with or without added adhesive layers), casting methods, injection molding methods, electrophoretic coating methods, powder coating methods and dip coating methods employing solvents, diluents, coloring agents, reinforcing agents and other additive agents as are desirable to provide other properties within the coating 11. Such other properties may include, but are not limited to coloration properties, toughness properties, crack resistance properties and abrasion resistance properties. Similarly, the coating 11 may also be formed through in-situ coating methods such as but not limited to chemically selective subtractive etching methods, physically selective subtractive etching methods, selective chemical growth methods, selective physical growth methods and aggregate methods thereof, which employ modification of the material from which is formed the substrate 10. Such aggregate methods may include, for example and without limitation, a selective subtractive etching of an metallic alloy substrate and subsequent oxidation of the etched metallic alloy substrate to form a highly porous metal oxide coating upon the metallic alloy substrate.

Finally, although not specifically illustrated in FIG. 4 or FIG. 5, the coating 11 may also have formed upon its surface additional coatings which provide additional properties to an object which is formed employing the coating 11. Such additional coatings may be thermally insulating coatings or thermally conductive coatings, while still preserving, at least in part, the thermal barrier properties of the coating 11.

EXAMPLES 1–5

In order to prophetically illustrate the value of the present invention in attenuating thermal sensation when handling an object while simultaneously minimally attenuating steady state thermal transfer with respect to the object, there was solved through a finite element approximation method, as is conventional in the art of heat transfer calculation, the values of a first temperature T1 at a first measurement location, a second temperature T2' at a specific second temperature measurement location and a third temperature T3 at a third measurement location of a substrate or a body, such as the substrate 10 and the body 12 as illustrated within the schematic cross-sectional diagram of FIG. 2, as a function of contact time of the body with the substrate, in accord with transient heat flow equations as are conventional in the art of heat transfer.

Figure 6:
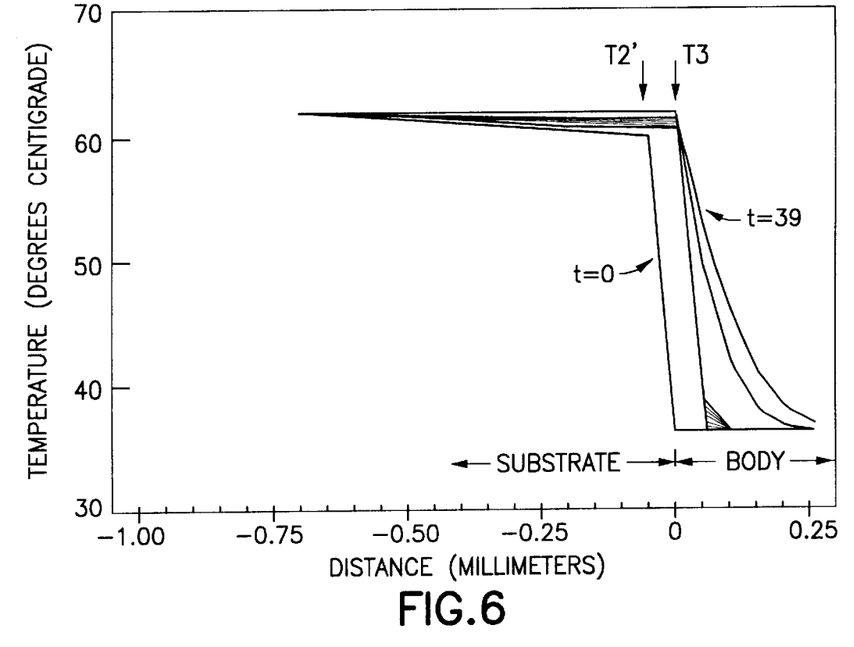
FIG. 6 shows a prophetic plot of Temperature versus Distance for transient heat flow at progressive times through a substrate formed of aluminum contacted with a body, in accord with the schematic cross-sectional diagram of FIG. 2.

Illustrated in FIG. 6 is a plot of Temperature versus Distance encompassing the second temperature T2' at the specific second temperature measurement location and the third temperature T3 at the third temperature measurement location resulting from transient heat flow at progressive times through the surface of a substrate formed of aluminum when contacted with a body in accord with the schematic cross-sectional diagram of FIG. 2. In obtaining the plot of FIG. 6, there was assumed: (1) an aluminum substrate thickness of 1.2 mm; (2) an aluminum substrate density of 2.707 grams per cubic centimeter; and (3) an aluminum substrate thermal conductivity of 204 watts per meter-degree centigrade. The density and thermal conductivity of the body were assumed to be equivalent to water, without convection, and the body was assumed to be an infinite sink for thermal flux flow. Similarly, there was also assumed a high temperature within a high temperature region, such as the high temperature region R1 illustrated in FIG. 2, of 62 degrees centigrade, a low temperature within a low temperature region, such as the low temperature region R2 illustrated in FIG. 2, of 25 degrees centigrade and a body temperature of 36 degrees centigrade.

Shown in the plot of FIG. 6 is the temperature profile through the substrate and into the body for the contact times of t=0 milliseconds and t=39 milliseconds, along with several intervening curves. Also illustrated is the location of measurement of the second temperature T2' at the specific second temperature measurement location and the third temperature T3 at the third temperature measurement location. The contact times begin with a contact time equal to zero (ie: t=0) and end with a contact time equal to 39 milliseconds a (ie: t=39). As is illustrated within the plot of FIG. 6, the third temperature T3 at the third temperature measurement location increases substantially within a short time period of less than 39 milliseconds, as can be seen more clearly in FIG. 7.

Figure 7:
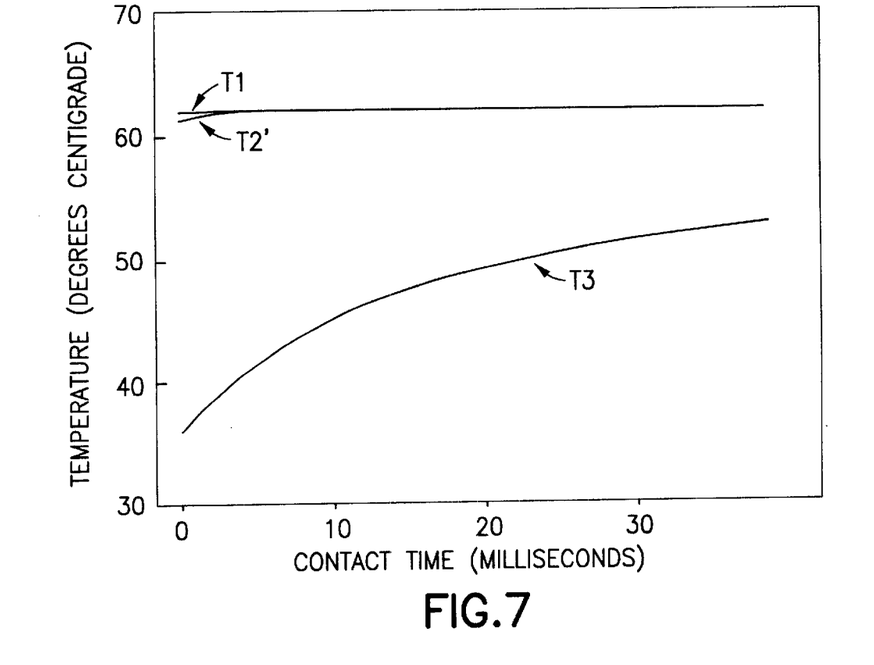
FIG. 7 shows a prophetic plot of Temperature versus Contact Time at the various temperature measurement locations in accord with the schematic cross-sectional diagram of FIG. 2, for transient heat flow through the substrate formed of aluminum contacted with a body, in accord with the schematic cross-sectional diagram of FIG. 2.

Shown in FIG. 7 is a plot of Temperature versus Contact Time for the first temperature T1 at the first temperature measurement location, the second temperature T2' at the specific second temperature measurement location and the third temperature T3 at the third temperature measurement location, in accord with the schematic cross-sectional diagram of FIG. 2, for transient heat flow through the substrate formed of aluminum in accord with the parameters employed in calculating the curves illustrated within FIG. 6. As is seen from the plot of FIG. 7, neither the first temperature T1 at the first temperature measurement location, nor the second temperature T2' at the specific second temperature measurement location decreases appreciably from a steady state temperature, but the third temperature T3 at the third temperature measurement location that corresponds to the temperature of the body at the point of contact with the substrate increases substantially within the short time period of about 39 milliseconds.

Figure 8:
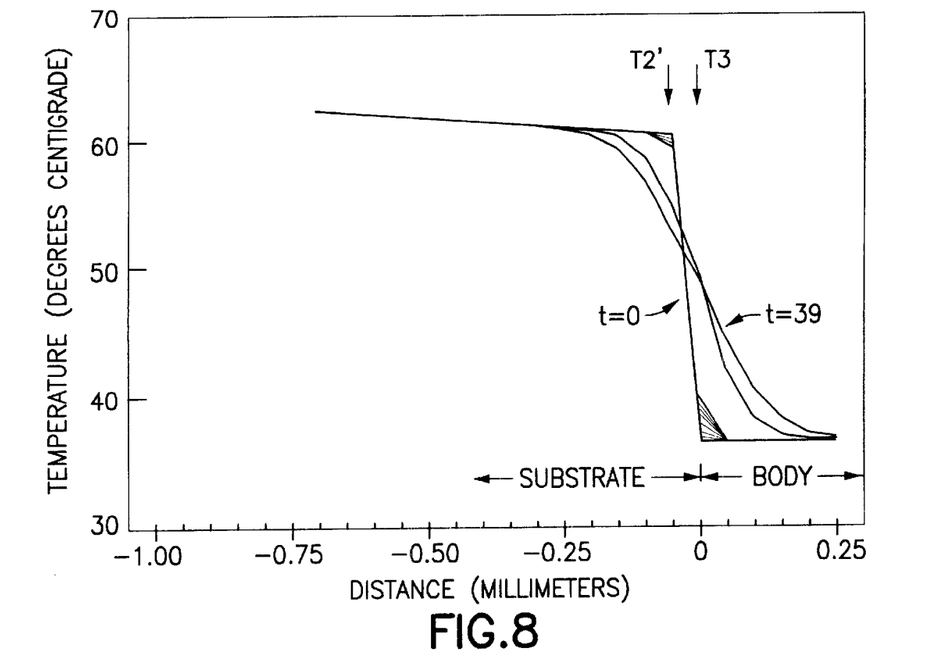
FIG. 8 shows a prophetic plot of Temperature versus Distance for transient heat flow at progressive times through a substrate formed of a polymer contacted with a body, in accord with the schematic cross-sectional diagram of FIG. 2.

Referring now to FIG. 8, there is shown a plot of Temperature versus Distance encompassing the second temperature T2' at the specific second temperature measurement location and the third temperature T3 at the third temperature measurement location resulting from transient heat flow at progressive times through the surface of a substrate formed of a polymer when contacted with a body in accord with the schematic cross-sectional diagram of FIG. 2. The plot of FIG. 8 follows analogously from the plot of FIG. 6, with the exception that there is employed within the plot of FIG. 8 a substrate formed of a polymer rather than of aluminum. In obtaining the plot of FIG. 6, there was assumed: (1) a polymer substrate thickness of 1.2 mm; (2) a polymer substrate density of 1.200 grams per cubic centimeter; and (3) a polymer substrate thermal conductivity of 0.15 watts per meter-degree centigrade, while still employing a density and thermal conductivity of the body as equivalent to water, without convection. Similarly with the plot of FIG. 6, there is observed within the plot of FIG. 8 a substantial increase in the third temperature T3 at the third temperature measurement location as a function of contact time of the body with the substrate formed of the polymer within a comparatively short contact timescale of about 39 milliseconds. In contrast with the plot of FIG. 6, there is also observed within the plot of FIG. 8 a substantial decrease of the second temperature T2' at the specific second temperature measurement location as a function of contact time of the body with the substrate formed of the polymer within the comparatively short contact timescale of about 39 milliseconds.

Figure 9:
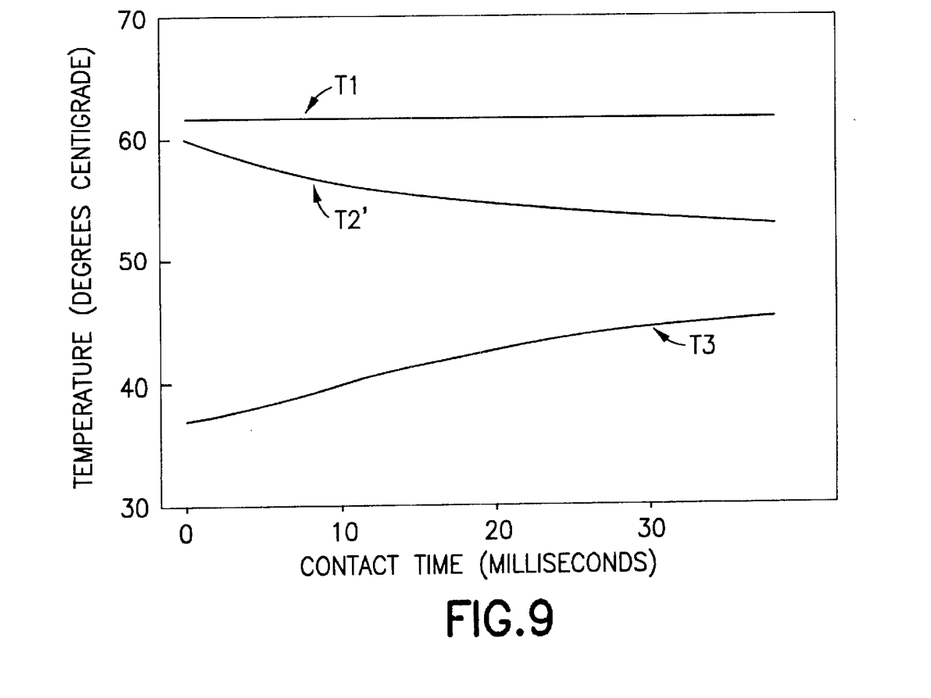
FIG. 9 shows a prophetic plot of Temperature versus Contact Time at the various temperature measurement locations in accord with the schematic cross-sectional diagram of FIG. 2, for transient heat flow through the substrate formed of the polymer contacted with a body, in accord with the schematic cross-sectional diagram of FIG. 2.

Referring now to FIG. 9, there is shown a plot of Temperature versus Contact Time for the first temperature T1 at the first temperature measurement location, the second temperature T2' at the specific second temperature measurement location and the third temperature T3 at the third temperature measurement location in accord with the schematic cross-sectional diagram of FIG. 2, for transient heat flow through the substrate formed of the polymer, in accord with the plot of FIG. 8. As is seen from the temperature-contact time profile curves within FIG. 9, the plot of FIG. 9 corresponds with the plot of FIG. 7 insofar as there exists a minimal decrease in the first temperature T1 at the first temperature measurement location. There is, however, a substantial decrease of the second temperature T2 at the second temperature measurement location and a less substantial increase in the third temperature T3 at the third temperature measurement location within the comparatively short time interval of about 39 milliseconds contact of the body with the substrate formed of the polymer in comparison with the corresponding temperature-contact time profile curves within FIG. 7.

Figure 10:
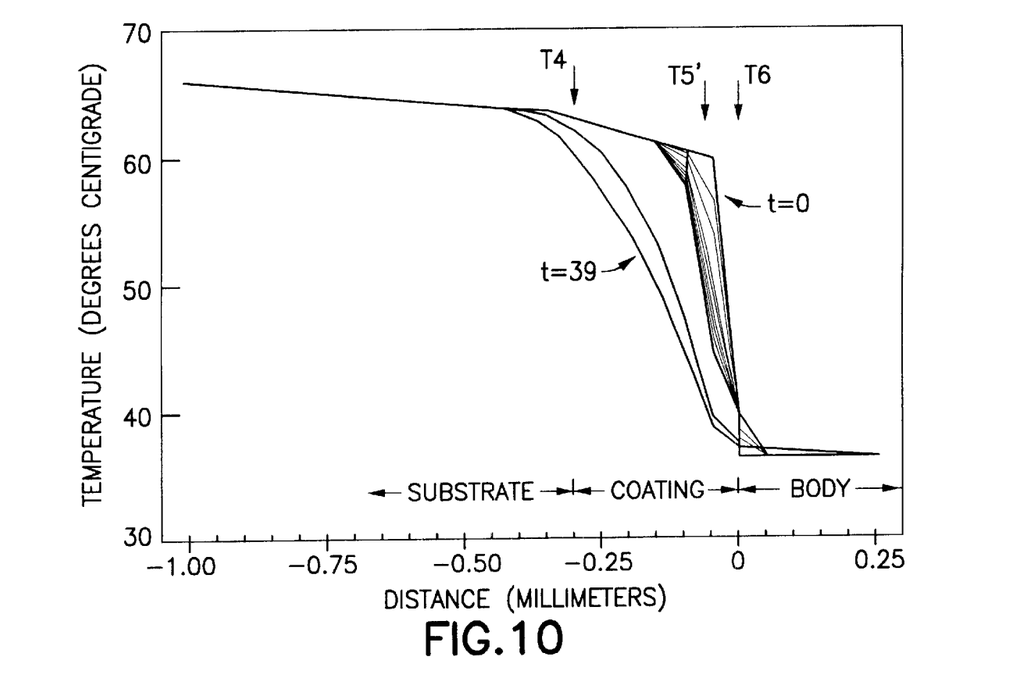
FIG. 10 shows a prophetic plot of Temperature versus Distance for transient heat flow at progressive times through a substrate formed of a polymer having formed thereupon a coating contacted with a body, in accord with the preferred embodiment of the present invention, as illustrated within the schematic cross-sectional diagrams of FIG. 4 and FIG. 5.

Referring now to FIG. 10 there is shown a plot of Temperature versus Distance for transient heat flow at progressive times through a substrate formed of a polymer having formed thereupon a coating in accord with the preferred embodiment of the present invention, as illustrated within the schematic diagrams of FIG. 4 and FIG. 5. The structure employed in calculating the temperature profile curves as illustrated in FIG. 10 is otherwise equivalent to the structure employed in calculating the temperature profile curves of FIG. 8, with the exception that there is formed upon the substrate formed of the polymer a coating.

In order to obtain the temperature profile curves within the plot of FIG. 10, there was employed a finite element approximation method analogous or equivalent to the finite element approximation method employed in solving for the first temperature T1 at the first temperature measurement location, the second temperature T2' at the specific second temperature measurement location and the third temperature T3 at the third temperature measurement location within the plots of FIG. 6 to FIG. 9. Through the finite element approximation method, there was calculated the first temperature T1 at the first temperature measurement location, the fourth temperature T4 at the fourth temperature measurement location, the fifth temperature T5' at the specific fifth temperature measurement location and the sixth temperature T6 at the sixth temperature measurement location, as illustrated in FIG. 4 and FIG. 5, as a function of a contact time of a body, such as the body 12 as illustrated in FIG. 4 and FIG. 5, with the coating, such as the coating 11 as illustrated in FIG. 4 and FIG. 5. thin the finite element approximation method, the coating was assumed to have a density of 0.050 grams per cubic centimeter, a thermal conductivity of 0.02 watts per meter-degree centigrade, a heat capacity of about 1.0 joules per gram per degree centigrade and a thickness of 0.3 millimeters.

In contrast with the temperature profile plots of FIG. 6 and FIG. 8, within the temperature profile plot of FIG. 10 there is no substantial increase of the sixth temperature T6 at the sixth temperature measurement location (which corresponds with the third temperature T3 at the third temperature measurement location within FIG. 6 and FIG. 8), but rather there is a substantial decrease in the fifth temperature T5' at the specific fifth temperature measurement location (which corresponds with the second temperature T2' at the specific second temperature measurement location within FIG. 6 and FIG. 8).

Figure 11:
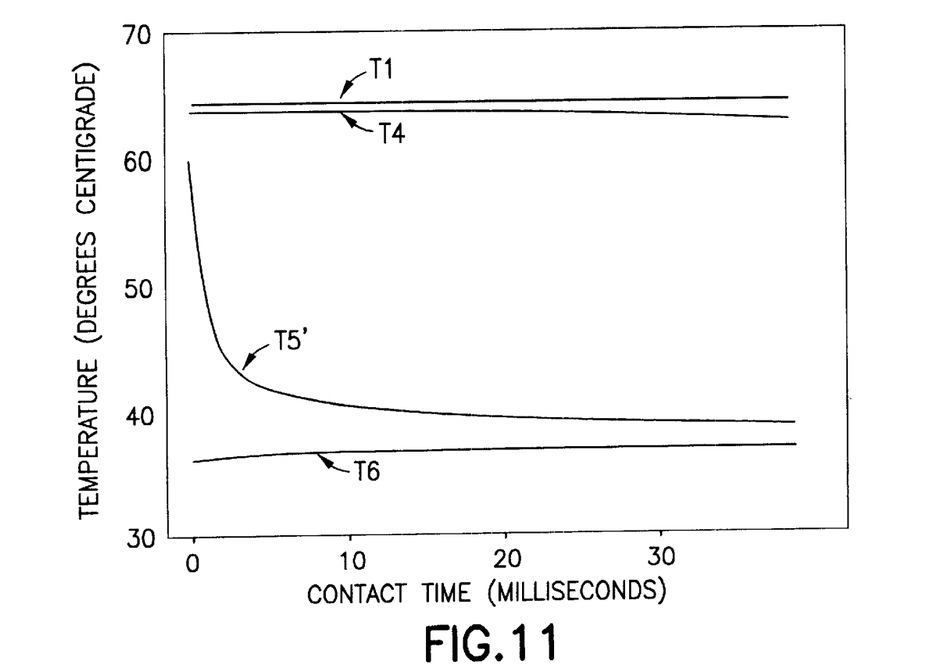
FIG. 11 shows a prophetic plot of Temperature versus Contact Time at the various temperature measurement locations in accord with the schematic cross-sectional diagrams of FIG. 4 and FIG. 5, for transient heat flow through the substrate formed of the polymer having formed thereupon the coating contacted with the body, in accord with the preferred embodiment of the present invention, as illustrated within the schematic cross-sectional diagrams of FIG. 4 and FIG. 5.

Referring now to FIG. 11, there is shown a plot of Temperature versus Contact Time for the first temperature T1 at the first temperature measurement location, the fourth temperature T4 at the fourth temperature measurement location, the fifth temperature T5' at the specific fifth temperature measurement location and the sixth temperature T6 at the sixth temperature measurement location in accord with the schematic cross-sectional diagrams of FIG. 4 and FIG. 5, for transient heat flow through the substrate formed of the polymer having formed thereupon the coating in accord with the preferred embodiment of the present invention. FIG. 11 corresponds, in general, with the temperature-contact time plots as illustrated in FIG. 7 and FIG. 9, with the exception that there is now added a temperature-contact time profile curve for the fourth temperature T4 at the fourth temperature measurement location.

As is shown in FIG. 11, the sixth temperature T6 at the sixth temperature measurement location increases towards the first temperature T1 at the first temperature measurement location at a rate substantially attenuated in comparison with the rate of increase of the third temperature T3 at the third temperature measurement location within the temperature-contact time profiles of FIG. 7 and FIG. 9.

Figure 12:
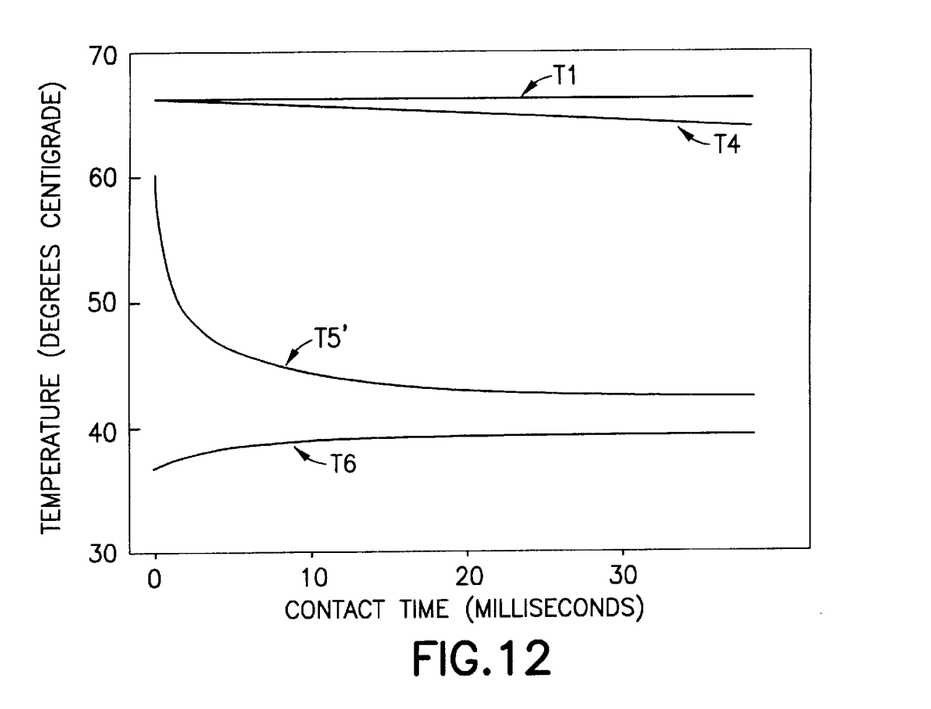
FIG. 12 shows a prophetic plot of Temperature versus Contact Time at the various temperature measurement locations in accord with the schematic cross-sectional diagrams of FIG. 4 and FIG. 5, for transient heat flow through a substrate formed of aluminum having formed thereupon a coating contacted with a body, the coating having a first thermal conductivity in accord with the preferred embodiment of the present invention, as illustrated within the schematic cross-sectional diagrams of FIG. 4 and FIG. 5.

Referring now to FIG. 12, there is shown a plot of Temperature versus Contact Time for the first temperature T1 at the first temperature measurement location, the fourth temperature T4 at the fourth temperature measurement location, the fifth temperature T5' at the specific fifth temperature measurement location and the sixth temperature T6 at the sixth temperature measurement location in accord with the schematic cross-sectional diagrams of FIG. 4 and FIG. 5, for transient heat flow through a substrate otherwise equivalent to the substrate employed in providing the temperature-contact time plot of FIG. 11, but wherein the substrate is a substrate formed of aluminum rather than a substrate formed of a polymer.

Figure 13:
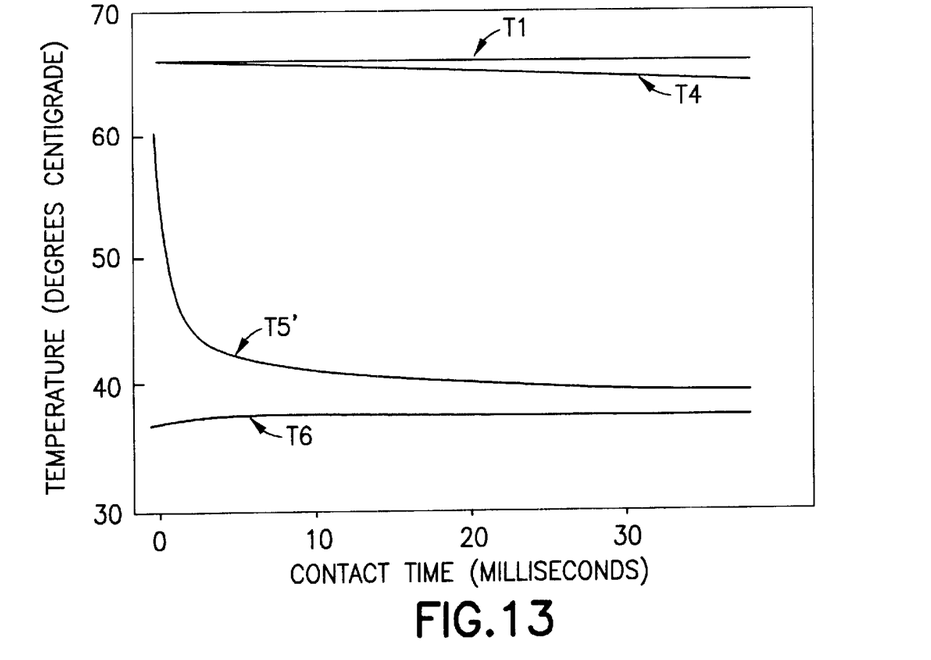
FIG. 13 shows a prophetic plot of Temperature versus Contact Time at the various temperature measurement locations in accord with the schematic cross-sectional diagrams of FIG. 4 and FIG. 5, for transient heat flow through a substrate formed of aluminum having formed thereupon a coating contacted with a body, the coating having a second thermal conductivity in accord with the preferred embodiment of the present invention, as illustrated within the schematic cross-sectional diagrams of FIG. 4 and FIG. 5.

Similarly, referring now to FIG. 13, there is shown a plot of Temperature versus Contact Time for the first temperature T1 at the first temperature measurement location, the fourth temperature T4 at the fourth temperature measurement location, the fifth temperature T5' at the specific fifth temperature measurement location and the sixth temperature T6 at the sixth temperature measurement location in accord with the schematic cross-sectional diagrams of FIG. 4 and FIG. 5, for transient heat flow through a substrate formed of aluminum having formed thereupon a coating otherwise equivalent to the coating employed in determining the plot of FIG. 12, but wherein the coating has a thermal conductivity of 0.06 watts per meter-degree centigrade rather than a thermal conductivity of 0.02 watts per meter-degree centigrade.

As is seen from review of the temperature-contact time curves within the plots of FIG. 12 and FIG. 13, the trends in temperature-contact time profiles of the first temperature T1 at the first temperature measurement location, the fourth temperature T4 at the fourth temperature measurement location, the fifth temperature T5' at the specific fifth temperature measurement location and the sixth temperature T6 at the sixth temperature measurement location correspond with the trends in temperature-contact time profiles of the first temperature T1 at the first temperature measurement location, the fourth temperature T4 at the fourth temperature measurement location, the fifth temperature T5' at the specific fifth temperature measurement location and the sixth temperature T6 at the sixth temperature measurement location, as illustrated in FIG. 11. In particular with respect to temperature-contact time profile of the sixth temperature T6 at the sixth temperature measurement location within FIG. 11, FIG. 12 and FIG. 13, the minimal rise in the sixth temperature T6 at the sixth temperature measurement location as a function of time may be employed to provide an object through which there is obtained minimal thermal sensation by a body when contacting the object.

In order to determine steady state heat transfer attenuation of the thermally conductive substrate structures whose temperature-contact time profiles are illustrated in FIG. 7, FIG. 9. FIG. 11, FIG. 12 and FIG. 13 there may be calculated the appropriate temperature differentials T1–T2 or T1–T5, through use of equation 1 or equation 2, as appropriate for individual substrate structures. Such temperature differentials are readily calculated and are presented in Table I, for a thermal flux of 250 watts per square meter.

TABLE I

| Example | Substrate Structure | S/S Temp. Diff. |
|---|---|---|
| 1 | 1.2 mm Al | <0.002 C. |
| 2 | 1.2 mm poly | 2 |
| 3 | 1.2 mm poly/0.3 mm ctg (ki = 0.02) | 5.8 |
| 4 | 1.2 mm Al/0.3 mm ctg (ki = 0.02) | 3.8 |
| 5 | 1.2 mm Al/0.3 mm ctg (ki = 0.06) | 1.3 |

It is seen from review of the data in Table I that there exists a minimal attenuation of steady state thermal transfer with respect to a substrate, as evidenced by a minimally increased temperature differential through the thickness of the substrate, when the substrate has formed thereupon a coating in accord with the preferred embodiment of the present invention.

EXAMPLES 6–7

There was obtained an aluminum sheet of thickness about 1.2 mm and thermal conductivity of about 204 watts per meter-degree centigrade. There was then formed upon the aluminum sheet a foamed urethane organic coating having dispersed therein a carbon black pigment at a loading of about 2 weight percent. The foamed urethane coating was formed from a urethane material foamed with water which upon reaction formed a carbon dioxide foamed urethane coating having a density of about 0.3 grams per cubic centimeter, a thermal conductivity of about 0.05 watts per meter-degree centigrade, a heat capacity of about 0.93 joules per gram per degree centigrade and a thickness of about 0.6 millimeters upon one side of the aluminum sheet.

The side of the aluminum sheet without the foamed urethane coating formed thereupon was then placed in contact with a precisely heated aluminum block and maintained at a temperature of about 60 degrees centigrade. Steady state temperatures of the side of the aluminum sheet in contact with the aluminum block and the exposed surface of the foamed urethane coating were obtained employing 42 gauge thermocouple wire which provided minimal additional thermal dissipation and determined to be about 60 degrees centigrade for the side of the aluminum sheet in contact with the aluminum block and about 57 degrees centigrade for the surface of the foamed urethane coating.

Figure 14:
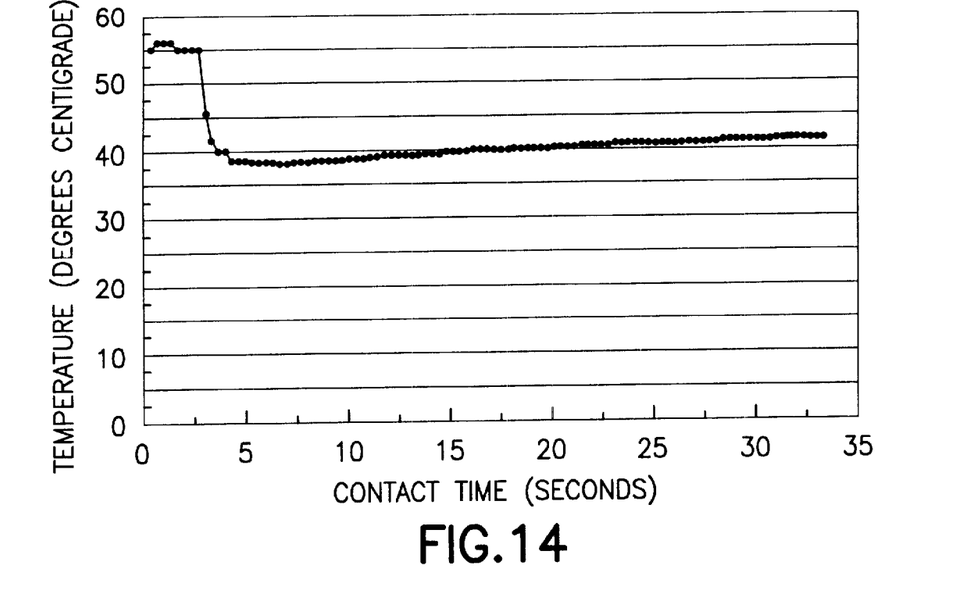
FIG. 14 shows a plot of Temperature versus Contact Time at a point of contact of a body with a substrate formed of aluminum having formed thereupon a coating in accord with the preferred embodiment of the present invention.

The thermocouple contacting the foamed urethane coating was then contacted with a finger of a human body at a temperature of about 32 degrees centigrade, where the body provided substantial thermal dissipation in comparison with the thermocouple. The thermocouple contacting the back side of the aluminum sheet in contact with the aluminum block measured a constant temperature of about 60 degrees centigrade, while the thermocouple contacting the foamed urethane coating measured a temperature which decreased precipitously to a temperature of about 37 degrees centigrade upon body contact with the thermocouple and subsequently rose slightly at an initial approximately linear rate of about 10 degrees centigrade per minute to reach a plateau of about 42 degrees centigrade in a time period of about 30 seconds. A plot of Temperature versus Contact Time for the thermocouple contacted region of the foamed urethane coating is shown in FIG. 14, where the discontinuity beginning at about 2.5 seconds indicates body contact with the thermocouple.

Figure 15:
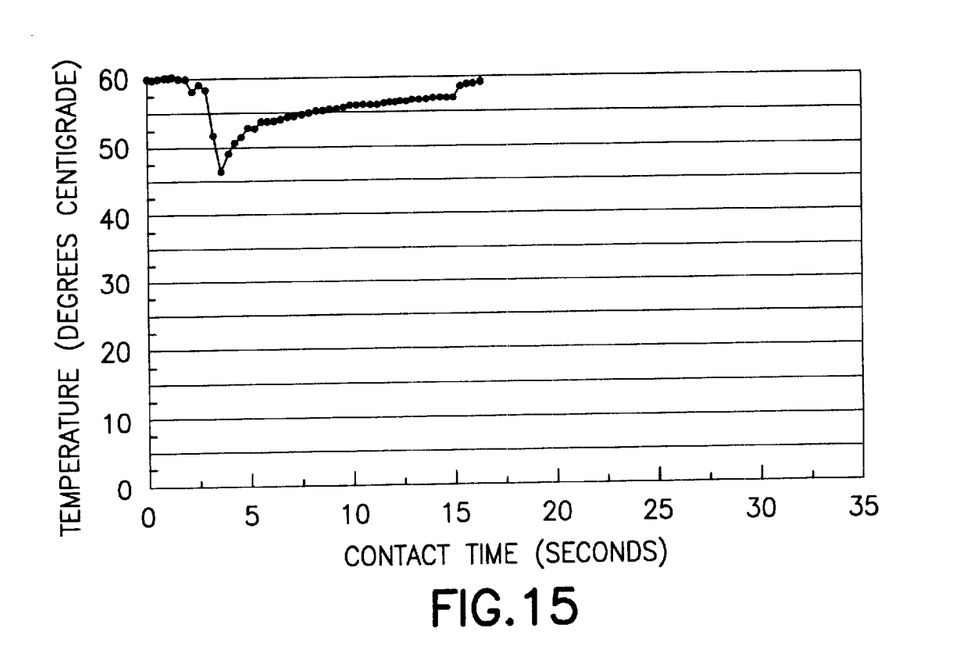
FIG. 15 shows a plot of Temperature versus Contact Time at a point of contact of a body with a substrate formed of aluminum without having formed thereupon a coating in accord with the preferred embodiment of the present invention.

For comparison purposes, a plot of Temperature versus Contact Time for a thermocouple contacted region of an otherwise equivalent aluminum substrate absent the foamed urethane coating is shown in FIG. 15. As is shown in FIG. 15, upon body contact with the thermocouple at about 2.5 seconds, the temperature measured by the thermocouple decreased precipitously to a temperature substantially above the body temperature and rapidly returned to the aluminum substrate temperature in less than about 20 seconds.

Thus, consistent with examples 1–5, it is seen from examples 6–7 that there may in practice be formed an object from a substrate having a coating formed thereupon, where the coating permits handling of the object with attenuated thermal sensation while simultaneously minimally attenuating a steady state thermal transfer with respect to the object in comparison with an otherwise equivalent object absent the coating.

As is understood by a person skilled in the art, the preferred embodiment and examples of the present invention are illustrative of the present invention rather than limiting of the present invention. Modifications and revisions may be made to materials, structures and dimensions through which is fabricated an object in accord with the preferred embodiment and examples of the present invention, while still providing an embodiment or example of an object in accord with the present invention, as defined by the appended claims.

What is claimed is:

1. A method for fabricating an electronics product comprising:
   providing an electronics product selected from the group consisting of handheld computers and mobile computers, the electronics product having a surface subject to handling
   forming upon the surface subject to handling a coating formed from an inorganic material, where the inorganic material has a density of tom about 0.05 to about 1.2 grams per cubic centimeter, a thermal conductivity of from about 0.02 to about 0.15 watts per meter-degree kelvin and a thickness of form about 0.1 to about 3.0 millimeters such that when the electronics product having the coating formed thereupon is equilibrated at a nonbody temperature differing from a body temperature and the coating is subsequently contacted with a body at the body temperature during handling, the body experiences an attenuated thermal sensation.

2. The method of claim 1 wherein the surface subject to handling is formed from a material selected from the group consisting of metals, metal alloys, metal oxides, unfilled plastics, filled plastics, reinforced plastics, and composites thereof.

3. The method of claim 1 wherein the surface subject to handling is selected from the group consisting of electronics enclosure volume case surfaces, electronics enclosure volume keyboard surfaces, and electronics enclosure volume keypad surfaces.

4. The method of claim 1 wherein the coating is formed employing an in-situ etch method which employs a subtractive etching modification of a material from which is formed the substrate.

5. An electronics product comprising:
   a substrate having a surface; and
   a coating formed upon the surface of the substrate, the coating being formed from an inorganic material having:
   a density of from about 0.05 to about 1.2 grams per cubic centimeter;
   a thermal conductivity of from about 0.02 to about 0.15 watts per meter-degree centigrade; and
   a thickness of from about 0.1 to about 3.0 millimeters, wherein the electronics product is selected from the group consisting of handheld computers and mobile computers.

6. The electronics product of claim 5 wherein the substrate is formed from a material selected from the group consisting of metals, metal alloys, metal oxides, unfilled plastics, filled plastics, reinforced plastics, and composites thereof.

7. An object comprising:
   a substrate having a surface; and
   a coating formed upon the surface of the substrate, the coating being formed from an inorganic material having:
   a thickness of from about 0.1 to about 3.0 millimeters;
   a density of from about 0.05 to about 1.2 grains per cubic centimeter; and
   a thermal conductivity of from about 0.02 to about 0.15 watts per meter-degree centigrade, wherein the object is selected from the group consisting of toasters, sandwich makers, hot plates and stethoscopes.

8. A method for fabricating an object comprising:
   providing a substrate, the substrate being employed within an object selected from the group consisting of toasters, sandwich makers, hotplates and stethoscopes, the substrate having a surface subject to handling;
   forming upon the surface subject to handling a coating, where the coating is formed from an inorganic material having a density of from about 0.05 to about 1.2 grams per cubic centimeter, a thermal conductivity of from about 0.02 to about 0.15 watts per meter-degree centigrade and a thickness of from about 0.1 to about 3.0 millimeters such that when the substrate having the coating formed thereupon is equilibrated at a non-body temperature differing from a body temperature and the coating is subsequently contacted with a body at the body temperature during handling, the body experiences an attenuated thermal sensation.

* * * * *